(12) United States Patent  
Cheng

(10) Patent No.: US 11,245,094 B2  
(45) Date of Patent: Feb. 8, 2022

(54) DISPLAY SUBSTRATE AND MANUFACTURE METHOD THEREOF, DISPLAY PANEL

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 128 days.

(21) Appl. No.: 16/335,599

(22) PCT Filed: Jun. 7, 2018

(86) PCT No.: PCT/CN2018/090202  
§ 371 (c)(1),  
(2) Date: Mar. 21, 2019

(87) PCT Pub. No.: WO2019/041945  
PCT Pub. Date: Mar. 7, 2019

(65) Prior Publication Data  
US 2020/0035946 A1 Jan. 30, 2020

(30) Foreign Application Priority Data  
Aug. 31, 2017 (CN) .......................... 201721107517.6

(51) Int. Cl.  
H01L 51/52 (2006.01)  
H01L 27/32 (2006.01)

(52) U.S. Cl.  
CPC ...... H01L 51/5253 (2013.01); H01L 27/3244 (2013.01); H01L 2227/323 (2013.01)

(58) Field of Classification Search  
None  
See application file for complete search history.

(56) References Cited

U.S. PATENT DOCUMENTS

| 10,197,877 | B2 | 2/2019 | Chan et al. |
| 2007/0159086 | A1* | 7/2007 | Yu ....................... H01L 27/3206 313/506 |
| 2014/0131683 | A1 | 5/2014 | Kim et al. |
| 2015/0060786 | A1 | 3/2015 | Kwak |
| 2016/0033811 | A1* | 2/2016 | Xu ..................... G02F 1/133512 257/72 |

(Continued)

FOREIGN PATENT DOCUMENTS

| CN | 103811530 A | 5/2014 |
| CN | 203883009 U | 10/2014 |

(Continued)

OTHER PUBLICATIONS

International Search Report of PCT/CN2018/090202 in Chinese, dated Sep. 12, 2018, with English translation.

(Continued)

Primary Examiner — Anthony Ho  
Assistant Examiner — Kevin Quinto  
(74) Attorney, Agent, or Firm — Collard & Roe, P.C.

(57) ABSTRACT

A display substrate and a manufacture method thereof, and a display panel are provided. The display substrate includes: a substrate, including a display region and a non-display region around the display region; at least one protrusion on the substrate. The protrusion is disposed in the non-display region.

14 Claims, 6 Drawing Sheets

(56) References Cited

U.S. PATENT DOCUMENTS

| | | | |
|---|---|---|---|
| 2016/0365395 A1 | 12/2016 | Xu et al. | |
| 2017/0033312 A1 | 2/2017 | Kim et al. | |
| 2017/0285424 A1* | 10/2017 | Kwak | G02F 1/13624 |
| 2018/0013092 A1* | 1/2018 | Park | H01L 51/0097 |

FOREIGN PATENT DOCUMENTS

| | | |
|---|---|---|
| CN | 104900681 A | 9/2015 |
| CN | 105810710 A | 7/2016 |
| CN | 106409869 A | 2/2017 |
| CN | 106848087 A | 6/2017 |
| CN | 207381403 U | 5/2018 |
| JP | 2003092192 A | 3/2003 |
| JP | 2005038842 A | 2/2005 |
| JP | 2005108824 A | 4/2005 |
| WO | 2017/118073 A1 | 7/2017 |

OTHER PUBLICATIONS

Notice of Transmittal of the International Search Report of PCT/CN2018/090202 in Chinese, dated Sep. 12, 2018.
Written Opinion of the International Searching Authority of PCT/CN2018/090202 in Chinese, dated Sep. 12, 2018 with English translation.
Indian Office Action in Indian Application No. 201917046445, dated Feb. 15, 2021.
Japanese Office Action in Japanese Application No. 2019-562268 dated Nov. 1, 2021 with English translation.

\* cited by examiner

DISPLAY SUBSTRATE AND MANUFACTURE METHOD THEREOF, DISPLAY PANEL

CROSS REFERENCE TO RELATED APPLICATIONS

This application is the National Stage of PCT/CN2018/090202 filed on Jun. 7, 2018, which claims priority under 35 U.S.C. § 119 of Chinese Application No. 201721107517.6 filed on Aug. 31, 2017, the disclosure of which is incorporated by reference.

TECHNICAL FIELD

At least one embodiment of the present disclosure relates to a display substrate and a manufacture method thereof, a display panel.

BACKGROUND

With the popularity of electronic display products, how to improve the adaptability to the environment of the electronic display products has attracted more and more users' attention. For example, in the manufacturing and using process of the electronic display products, water vapor, oxygen, and so on in the outside environment may intrude into inside the electronic display products, for example, water vapor, oxygen, and so on may react with the internal structure of the electronic display products, and affect electrical properties of the electronic display products, thereby degrading the performance and reducing life time of the electronic display products. However, for the above problems, although various manufacturers have developed a variety of package technologies, the current package technologies cannot meet further requirements of customers for package effects of the electronic display products.

SUMMARY

At least one embodiment of the present disclosure provides a display substrate, which comprises: a substrate, comprising a display region and a non-display region around the display region; and at least one protrusion on the substrate. The protrusion is in the non-display region.

For example, in the display substrate provide by at least one embodiment of the present disclosure, the display substrate further comprises: a passivation layer on the substrate. The protrusion is between the substrate and the passivation layer, and the passivation layer covers at least a portion of the protrusion.

For example, in the display substrate provide by at least one embodiment of the present disclosure, the display substrate further comprises: at least one of an interlayer insulating layer, a gate insulating layer and a buffer layer between the passivation layer and the substrate.

For example, in the display substrate provide by at least one embodiment of the present disclosure, at least one protrusion is between the passivation layer and the interlayer insulating layer; and/or at least one protrusion is between the interlayer insulating layer and the gate insulating layer; and/or at least one protrusion is between the gate insulating layer and the buffer layer; and/or at least one protrusion is between the buffer layer and the substrate.

For example, in the display substrate provide by at least one embodiment of the present disclosure, at least a portion of the protrusion is configured to be in a same layer and made of a same material as the interlayer insulating layer; and/or at least a portion of the protrusion is configured to be in a same layer and made of a same material as the gate insulating layer; and/or at least a portion of the protrusion is configured to be in a same layer and made of a same material as the buffer layer.

For example, in the display substrate provide by at least one embodiment of the present disclosure, at least a portion of the protrusion is configured to comprise a stack layer of a first protrusion and a second protrusion. The first protrusion is configured to be in a same layer and made of a same material as the at least one of the interlayer insulating layer, the gate insulating layer and the buffer layer, and the second protrusion is configured as a photoresist material.

For example, in the display substrate provide by at least one embodiment of the present disclosure, a preparing material of the protrusion comprises a photoresist material.

For example, in the display substrate provide by at least one embodiment of the present disclosure, a height of the protrusion is 0.2 μm-3 μm in a direction perpendicular to a plane on which the substrate is disposed; and a width of the protrusion is 3 μm-9 μm in a direction parallel to the plane on which the substrate is disposed.

For example, in the display substrate provide by at least one embodiment of the present disclosure, on a same layer parallel to the plane on which the substrate is disposed, the protrusion at least comprises a first protrusion portion and a second protrusion portion that are sequentially disposed around the display region, the first protrusion portion and the second protrusion portion are in a same layer, and the first protrusion portion is disposed inside the second protrusion portion.

For example, in the display substrate provide by at least one embodiment of the present disclosure, a spacing distance between the first protrusion and the second protrusion is 3 μm-10 μm in the direction parallel to the plane on which the substrate is disposed.

For example, in the display substrate provide by at least one embodiment of the present disclosure, in the direction perpendicular to the plane on which the substrate is disposed, the protrusion at least comprises a first protrusion layer and a second protrusion layer that are in different layers, and the first protrusion layer is between the second protrusion layer and the substrate.

For example, in the display substrate provide by at least one embodiment of the present disclosure, an orthographic projection of the first protrusion layer on the substrate coincides with an orthographic projection of the second protrusion layer on the substrate; alternatively, the orthographic projection of the first protrusion layer on the substrate is outside the orthographic projection of the second protrusion layer on the substrate.

For example, in the display substrate provide by at least one embodiment of the present disclosure, the protrusion is disposed in an annular structure and surrounds the display region. Each protrusion is disposed in an integrated closed annular structure; alternatively, each protrusion is disposed to comprise at least two protrusion segments that are spaced apart from each other.

For example, in the display substrate provide by at least one embodiment of the present disclosure, the display substrate further comprises: an encapsulation layer on a side of the passivation layer that is away from the substrate; and the substrate of the display region comprises a plurality of pixel regions, at least one organic light emitting member is disposed on the substrate of each of the pixel regions, and the organic light emitting member is between the passivation layer and the encapsulation layer.

For example, in the display substrate provide by at least one embodiment of the present disclosure, an orthographic projection of the protrusion on the substrate is within an orthographic projection of the encapsulation layer on the substrate.

For example, in the display substrate provide by at least one embodiment of the present disclosure, the display substrate further comprises: at least one of a buffer layer, a gate insulating layer, an interlayer insulating layer, a passivation layer and a planarization layer on the substrate.

For example, in the display substrate provide by at least one embodiment of the present disclosure, at least a portion of the protrusion is configured to be in a same layer and made of a same material as the interlayer insulating layer; and/or at least a portion of the protrusion is configured to be in a same layer and made of a same material as the gate insulating layer; and/or at least a portion of the protrusion is configured to be in a same layer and made of a same material as the buffer layer; and/or at least a portion of the protrusion is configured to be in a same layer and made of a same material as the passivation layer; and an orthographic projection of the protrusion on the substrate is within an orthographic projection of the planarization layer on the substrate.

For example, in the display substrate provide by at least one embodiment of the present disclosure, the display substrate further comprises: a buffer layer, a gate insulating layer, an interlayer insulating layer, a passivation layer and a planarization layer on the substrate. At least a portion of the protrusion is configured to be in a same layer and made of a same material as the interlayer insulating layer; and/or at least a portion of the protrusion is configured to be in a same layer and made of a same material as the gate insulating layer; and/or at least a portion of the protrusion is configured to be in a same layer and made of a same material as the passivation layer; an orthographic projection of the protrusion on the substrate is within an orthographic projection of the planarization layer on the substrate, and an orthographic projection of the protrusion on the substrate is within an orthographic projection of the buffer layer on the substrate.

For example, in the display substrate provide by at least one embodiment of the present disclosure, the display substrate further comprises: a buffer layer, a gate insulating layer, an interlayer insulating layer and a planarization layer on the substrate. At least a portion of the protrusion is configured to be in a same layer and made of a same material as the interlayer insulating layer; and/or at least a portion of the protrusion is configured to be in a same layer and made of a same material as the gate insulating layer; an orthographic projection of the protrusion on the substrate is within an orthographic projection of the planarization layer on the substrate, and an orthographic projection of the protrusion on the substrate is within an orthographic projection of the buffer layer on the substrate.

For example, in the display substrate provide by at least one embodiment of the present disclosure, at least two protrusions are disposed on a same side of the display region.

For example, in the display substrate provide by at least one embodiment of the present disclosure, a height of the protrusion is 0.2 μm-3 μm in a direction perpendicular to a plane on which the substrate is disposed; a width of the protrusion is 3 μm-9 μm in a direction parallel to the plane on which the substrate is disposed; and a spacing distance between two adjacent protrusions is 3 μm-10 μm in the direction parallel to the plane on which the substrate is disposed.

At least one embodiment of the present disclosure provides a display panel, comprising the display substrate according to any one of the above embodiments.

At least one embodiment of the present disclosure provides a manufacture method of a display substrate, comprising: providing a substrate, the substrate comprising a display region and a non-display region around the display region; and forming at least one protrusion on the substrate. The protrusion is formed in the non-display region.

For example, the manufacture method of a display substrate provide by at least one embodiment of the present disclosure further comprises: forming a passivation layer on the substrate. The protrusion is formed between the substrate and the passivation layer, and at least a portion of the passivation layer covers the protrusion.

For example, the manufacture method of a display substrate provide by at least one embodiment of the present disclosure further comprises: forming a planarization layer on the substrate; and forming at least one of a buffer layer, a gate insulating layer, an interlayer insulating layer and a passivation layer between the substrate and the planarization layer. An orthographic projection of the protrusion on the substrate is within an orthographic projection of the planarization layer on the substrate, at least a portion of the protrusion is configured to be in a same layer and made of a same material as the interlayer insulating layer; and/or at least a portion of the protrusion is configured to be in a same layer and made of a same material as the gate insulating layer; and/or at least a portion of the protrusion is configured to be in a same layer and made of a same material as the buffer layer; and/or at least a portion of the protrusion is configured to be in a same layer and made of a same material as the passivation layer.

For example, the manufacture method of a display substrate provide by at least one embodiment of the present disclosure further comprises: forming a buffer layer, a gate insulating layer, an interlayer insulating layer, a passivation layer and a planarization layer on the substrate. An orthographic projection of the protrusion on the substrate is within an orthographic projection of the planarization layer on the substrate, and an orthographic projection of the protrusion on the substrate is within an orthographic projection of the buffer layer on the substrate, and at least a portion of the protrusion is configured to be in a same layer and made of a same material as the interlayer insulating layer; and/or at least a portion of the protrusion is configured to be in a same layer and made of a same material as the gate insulating layer; and/or at least a portion of the protrusion is configured to be in a same layer and made of a same material as the passivation layer.

For example, the manufacture method of a display substrate provide by at least one embodiment of the present disclosure further comprises: forming a buffer layer, a gate insulating layer, an interlayer insulating layer and a planarization layer on the substrate. An orthographic projection of the protrusion on the substrate is within an orthographic projection of the planarization layer on the substrate, and an orthographic projection of the protrusion on the substrate is within an orthographic projection of the buffer layer on the substrate, and at least a portion of the protrusion is configured to be in a same layer and made of a same material as the interlayer insulating layer; and/or at least a portion of the protrusion is configured to be in a same layer and made of a same material as the gate insulating layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the present disclosure.

REFERENCE NUMERALS

Figure 1:
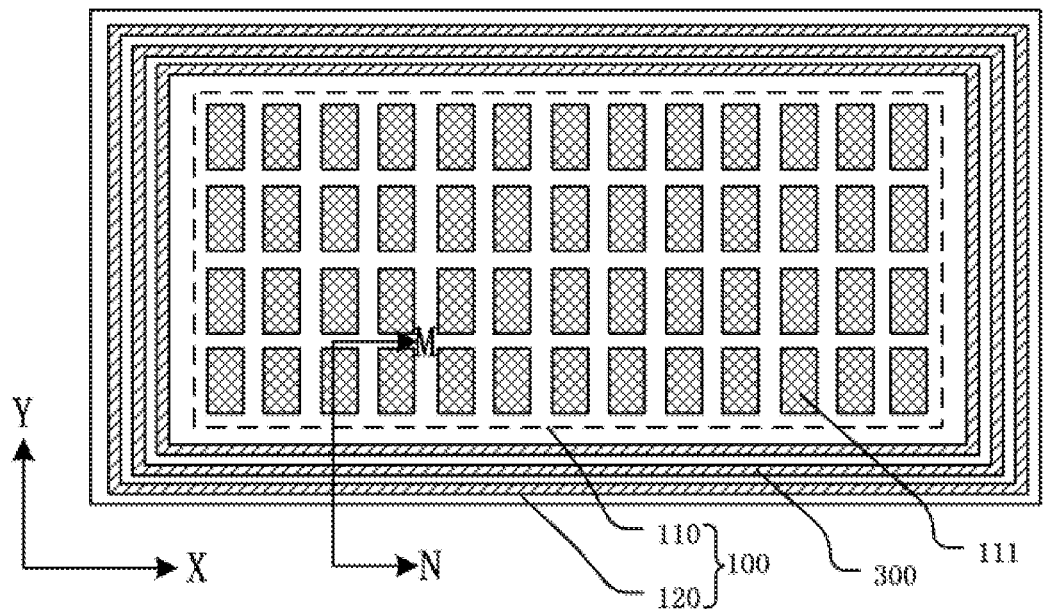
FIG. 1 is a plan view of a display substrate provided by an embodiment of the present disclosure.

100—substrate; 110—display region; 111—pixel region; 120—non-display region; 200—passivation layer; 300—protrusion; 301—first protrusion; 302—second protrusion; 311—first protrusion portion; 312—second protrusion portion; 321—first protrusion layer; 322—second protrusion layer; 330—protrusion segment; 331—first protrusion segment; 332—second protrusion segment; 400—thin film transistor; 410—buffer layer; 420—gate insulating layer; 430—interlayer insulating layer; 500—planarization layer; 600—encapsulation layer; 700—pixel definition layer; 800—organic light emitting member; 810—first electrode; 820—organic light emitting layer; 830—second electrode; 900—sealant; 1000—filling layer; 1100—opposite substrate.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At least one embodiment of the present disclosure provides a display substrate, the display substrate comprises a substrate and at least one protrusion on the substrate. The substrate comprises a display region and a non-display region around the display region; and the protrusion is disposed on the substrate in the non-display region. In the non-display region, the protrusion increases paths for substances such as water, oxygen and the like to intrude into inside of the display substrate so as to protect components in the display substrate.

In the following, the display substrate and the manufacture method thereof, the display panel according to at least one embodiment of the present disclosure will be described with reference to the accompanying drawings.

At least one embodiment of the present disclosure provides a display substrate. FIG. 1 is a plan view of a display substrate provided by an embodiment of the present disclosure. For example, as illustrated in FIG. 1, the display substrate comprises a substrate 100 and a protrusion 300 disposed on the substrate 100. The substrate 100 comprises a display region 100 and a non-display region 120 located around the display region 100. The protrusion 300 is disposed on the substrate 100 in the non-display region 120. The protrusion 300 is disposed around the display region 110, and in the process of water, oxygen and so on outside to enter inside of the display substrate, the protrusion 300 increases an intruding path of water, oxygen, and so on, so as to protect, for example, components in the display region 110.

In at least one embodiment of the present disclosure, the arrangement manner of the protrusion 300 may be various. The specific arrangement manner of the protrusion 300 is not limited by at least one embodiment of the present disclosure, as long as the arrangement of the protrusion 300 can increase the path of water, oxygen, and so on to intrude into inside of the display substrate. In the following, the structure of the display substrate in the embodiment of the present disclosure will be described based on different arrangement manners of the protrusion 300.

Figure 2:
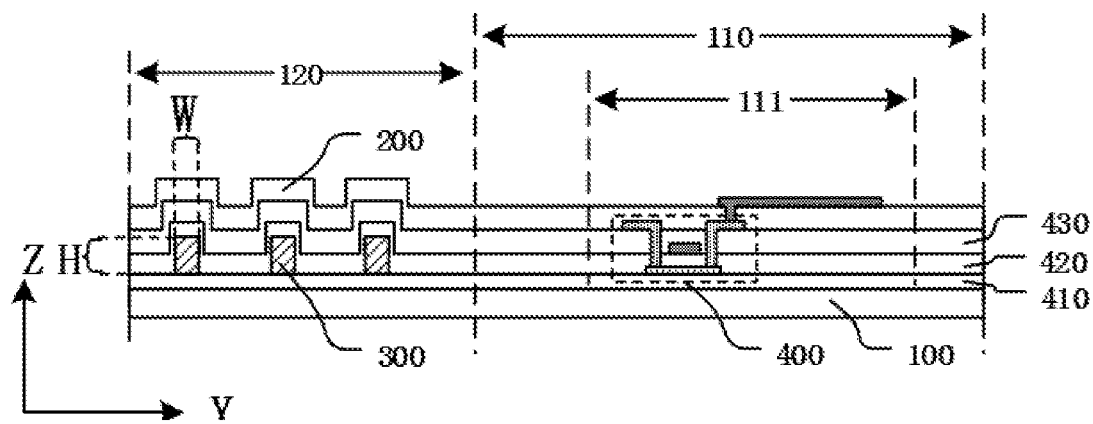
FIG. 2 is a cross-sectional view of the display substrate in FIG. 1 along M-N.

For example, in at least one embodiment of the present disclosure, FIG. 2 is a cross-sectional view of the display substrate of FIG. 1 along M-N. For example, as illustrated in FIGS. 1 and 2, the display substrate comprises a substrate 100 and a passivation layer 200 disposed on the substrate 100. For example, in some embodiments of the present disclosure, the protrusion 300 may be configured to increase the path of water, oxygen, and so on intruding into the interior of the display substrate along a surface of the passivation layer 200; for example, in other embodiments of the present disclosure, the protrusion 300 may be configured to increase the path of water and oxygen intruding into the interior of the display substrate along other structures.

In the following, the case that the arrangement of the protrusion 300 can increase the path of water, oxygen, and so on intruding into the interior of the display substrate along the surface of the passivation layer 200 is taken as an example to illustrate the specific structure of the display substrate.

For example, in at least one embodiment of the present disclosure, as illustrated in FIG. 2, the display substrate comprises the passivation layer 200 disposed on the substrate 100, and the protrusion 300 is located between the passivation layer 200 and the substrate 100, and the passivation layer 200 at least partially covers the protrusion 300. For example, in at least one embodiment of the present disclosure, as illustrated in FIG. 2, in the non-display region 120, the passivation layer 200 is disposed along the protrusion 300, so that a surface area of a surface of the passivation layer 200 facing the substrate 100 is increased, the path of outside water and oxygen intruding into the interior of the display substrate is increased, and the protrusion 300 increases the adhesion area of the passivation layer 200 on the display substrate, thereby increasing the adhesion firmness of the passivation layer 200 on the display substrate, and improving the package effect of the display substrate. For example, the passivation layer 200 may be disposed to cover the whole protrusion 300, that is, an orthographic projection of the protrusion 300 on the substrate 100 may be within an orthographic projection of the passivation layer 200 on the substrate 100.

In at least one embodiment of the present disclosure, a preparing material of the substrate 100 in the display substrate is not limited. For example, the preparation material of the base may be a glass substrate, a quartz substrate or a resin material, and the resin material, for example, includes one or more of polyimide, polycarbonate, polyacrylate, polyetherimide, polyethersulfone, polyethylene terephthalate, polyethylene naphthalate and the like.

In at least one embodiment of the present disclosure, a preparing material of the passivation layer 200 is not limited. For example, the preparing material of the passivation layer 200 may comprise silicon nitride (SiNx), silicon oxide (SiOx), silicon oxynitride (SiNxOy), or other suitable materials.

In order to facilitate the description of positions of the components in the technical solution of the present disclosure, as illustrated in FIGS. 1 and 2, a three-dimensional coordinate system is established with reference to the substrate 100 in the display substrate to direct the components in the display substrate. For example, in the above three-dimensional coordinate system, directions of an X-axis and a Y-axis are parallel to a direction of a plane on which the substrate 100 is disposed, and a direction of a Z-axis is perpendicular to the direction of the plane on which the substrate 100 is disposed.

For example, in at least one embodiment of the present disclosure, the display substrate is an array substrate. For example, as illustrated in FIGS. 1 and 2, the substrate 100 of the display region 110 comprises a plurality of pixel regions 111, and at least one switching element such as a thin film transistor 400 is disposed in each of the pixel regions 111. Correspondingly, for example, in at least one embodiment of the present disclosure, the display substrate may further comprise at least one of a buffer layer 410, a gate insulating layer 420, and a interlayer insulating layer 430 between the substrate 100 and the passivation layer 200.

At least one embodiment of the present disclosure does not limit preparing materials of the buffer layer 410, the gate insulating layer 420, and the interlayer insulating layer 430, which may be selected according to actual requirements.

For example, in at least one embodiment of the present disclosure, the preparation material of the buffer layer 410 may comprise an oxide of silicon (SiOx) or a nitride of silicon (SiNx). For example, the buffer layer 410 may be a single layer structure composed of silicon nitride or silicon oxide, or may be a double layer structure composed of silicon nitride and silicon oxide.

For example, in at least one embodiment of the present disclosure, the preparing material of the gate insulating layer 420 may comprise silicon nitride (SiNx), silicon oxide (SiOx), aluminum oxide ($Al_2O_3$), aluminum nitride (AlN), or other suitable materials.

For example, in at least one embodiment of the present disclosure, the interlayer insulating layer 430 may be a single layer structure or a structure of two or more layers. For example, the material of the interlayer insulating layer 430 may comprise an inorganic insulating material such as silicon nitride or silicon oxide, or may comprise an organic insulating material.

In at least one embodiment of the present disclosure, the specific structure of the thin film transistor 400 is not limited. For example, the thin film transistor 400 may further comprise an active layer, a gate electrode, a source-drain electrode layer (comprising a source electrode and a drain electrode) and the like. Components such as the active layer, the gate electrode, the source-drain electrode layer, and so on in the thin film transistor 400 may be affected by water, oxygen, or the like, thereby degrading the electrical performances of the thin film transistor 400. The protrusion 300 disposed between the substrate 100 and the passivation layer 200 may increase the path of water and oxygen intruding into the interior of the display substrate from a region between the substrate 100 and the passivation layer 200, thereby protecting the thin film transistor 400. For example, the thin film transistor 400 may be a bottom gate type thin film transistor, a top gate type thin film transistor, or a double gate type thin film transistor.

It should be noted that the arrangement of the protrusion 300 is not limited to only protect the above thin film transistor 400, and other components such as components between the substrate 100 and the passivation layer 200 in the display substrate may also be protected. The relation between the components to be protected and the position at which the protrusion 300 is disposed may be designed according to actual conditions, and at least one embodiment of the present disclosure does not limit this.

It should be noted that, in at least one embodiment of the present disclosure, there is no limitation on whether or not the buffer layer 410 is disposed in the display substrate. For example, in the situation where the thin film transistor is the bottom gate type thin film transistor or the double gate type thin film transistor, the buffer layer 410 may not be provided in the display substrate. In the following, the following embodiment of the present disclosure will be described by taking the buffer layer 410 being disposed in the display substrate as an example.

In at least one embodiment of the present disclosure, the specific structure and the specific arrangement position of the protrusion 300 are not limited as long as the arrangement of the protrusion 300 can increase the path of water, oxygen, and so on intruding into the interior of the display substrate. In the following, in at least one embodiment of the present disclosure, several arrangement positions and several arrangement structures of the protrusion 300 will be described, respectively.

For example, in at least one embodiment of the present disclosure, as illustrated in FIG. 2, the protrusion 300 may be disposed between at least two adjacent layers of the passivation layer 200, the interlayer insulating layer 430, the gate insulating layer 420, the buffer layer 410, and the substrate 100. For example, at least one protrusion 300 is disposed between the passivation layer 200 and the interlayer insulating layer 430; and/or at least one protrusion 300 is disposed between the interlayer insulating layer 430 and the gate insulating layer 420; and/or at least one protrusion 300 is disposed between the gate insulating layer 420 and the buffer layer 410; and/or at least one protrusion 300 is disposed between the buffer layer 410 and the substrate 100. For example, the buffer layer 410 is not disposed in the display substrate, and at least one protrusion 300 may be disposed between the gate insulating layer 420 and the substrate 100.

Exemplarily, as illustrated in FIG. 2, the protrusion 300 is disposed between the buffer layer 410 and the gate insulating layer 420, thus increasing the path of water, oxygen, and so on intruding into the interior of the substrate along an interface between the buffer layer 410 and the gate insulating layer 420. Besides, the interlayer insulating layer 430 and the passivation layer 200 on the gate insulating layer 420 are formed to have as uneven portions corresponding to the protrusion 300, so that areas of the interface between the gate insulating layer 420 and the interlayer insulating layer 430 and the interface between the interlayer insulating layer 430 and the passivation layer 200 are increased, and correspondingly, the paths of water and oxygen intruding into the interior of the substrate along the interface between the gate insulating layer 420 and the interlayer insulating layer 430, and the interface between the interlayer insulating layer 430 and the passivation layer are increased, and the connection firmness of the gate insulating layer 420 and the interlayer insulating layer 430 and the connection firmness of the interlayer insulating layer 430 and the passivation layer 200 are increased, and the package effect of the display substrate is improved.

Figure 3:
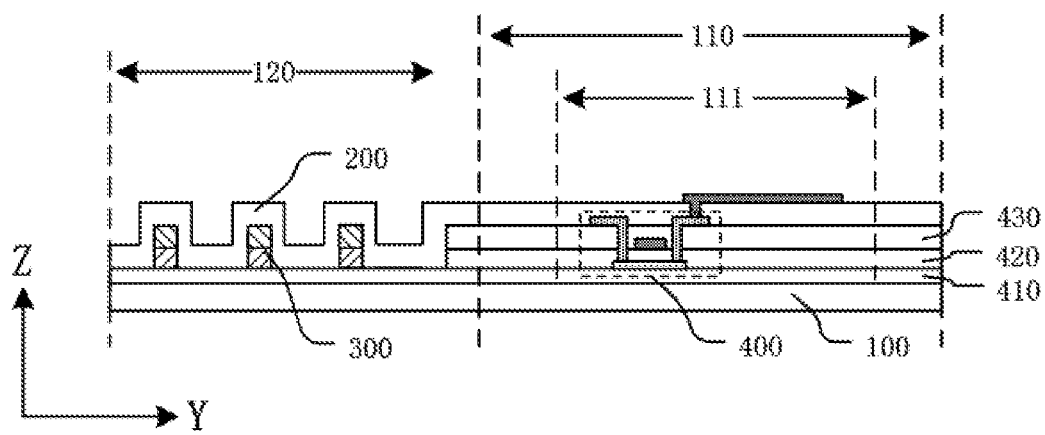
FIG. 3 is a partial cross-sectional view of another display substrate provided by an embodiment of the present disclosure.

For example, in at least one embodiment of the present disclosure, FIG. 3 is a partial cross-sectional view of another display substrate provided by an embodiment of the present disclosure. For example, as illustrated in FIG. 3, a portion, in the non-display region 120, of at least one of the buffer layer 410, the gate insulating layer 420, and the interlayer insulating layer 430 in the display substrate is configured as at least a portion of the protrusion 300. Therefore, the manufacture process of the display substrate can be simplified, and the cost can be reduced. For example, at least a portion of the protrusion 300 is configured to be in a same layer as the interlayer insulating layer 430 and made of a same material as the interlayer insulating layer 430; and/or at least a portion of the protrusion 300 is configured to be in a same layer and made of a same material as the gate insulating layer 420. For example, the buffer layer 410 is disposed in the display substrate, and at least a portion the protrusion 300 may be configured to be in a same layer and made of a same material as the buffer layer 410.

Exemplarily, as illustrated in FIG. 3, a portion, in the non-display region 120, of the gate insulating layer 420 in the display substrate and a portion, in the non-display region 120, of the interlayer insulating layer 430 in the display substrate are configured as the protrusion 300. For example, in the manufacture process of the display substrate, after the gate insulating layer 420 and the interlayer insulating layer 430 are formed on the substrate 100, a patterning process is performed to the gate insulating layer 420 and the interlayer insulating layer 430 in the non-display region 120, so that the protrusion 300 is formed by the gate insulating layer 420 and the interlayer insulating layer 430 in the non-display region 120. For example, in the manufacture process of the thin film transistor, a via hole for connecting the source-drain electrode layer and the active layer needs to be formed in the gate insulating layer 420 and the interlayer insulating layer 430, so that when the via hole is formed by a patterning process, the protrusion 300 may be formed simultaneously.

In at least one embodiment of the present disclosure, the patterning process may be, for example, a photolithographic patterning process, which may comprise, for example, coating a photoresist material film on a structure layer to be patterned, and the coating of the photoresist material film may adopt a method of spin coating, blade coating, or roll coating; then exposing the photoresist material layer using a mask, and developing the exposed photoresist material layer to obtain a photoresist material pattern; and then etching the structure layer using the photoresist material pattern, and the photoresist material pattern is selectively removed; finally, the remaining photoresist material is stripped to form the desired pattern structure.

Figure 4:
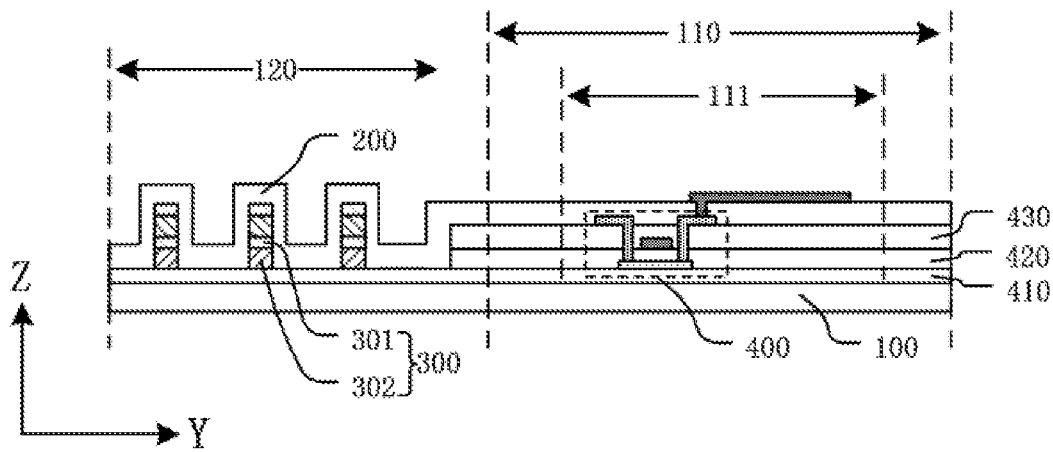
FIG. 4 is a partial cross-sectional view of another display substrate provided by an embodiment of the present disclosure.

For example, in at least one embodiment of the present disclosure, FIG. 4 is a partial cross-sectional view of another display substrate provided by an embodiment of the present disclosure. For example, as illustrated in FIG. 4, at least a portion of the protrusion 300 is configured to comprise a stack layer of a first protrusion 301 and a second protrusion 302. The first protrusion 301 may be configured to be in a same layer and made of a same material as at least one of the interlayer insulating layer 430, the gate insulating layer 420 and the buffer layer 410, and the second protrusion 302 is configured as a photoresist material. For example, the protrusion 300 comprises a plurality of first protrusions 301 and a plurality of second protrusions 302, and the first protrusions 301 and the second protrusions 302 are alternately disposed in a direction parallel to the Z-axis. Therefore, the height of the protrusion 300 in the direction parallel to the Z-axis (a distance between one end of the protrusion 300 that is away from the substrate 100 and the other end of the protrusion 300 that is close to the substrate 100) can be further increased, so as to increase the path of water and oxygen intruding into the interior of the display substrate, simplify the manufacture process of the display substrate and reduce the cost.

Exemplarily, as illustrated in FIG. 4, each protrusion in the display substrate comprises two first protrusions 301 and two second protrusions 302, and the two first protrusions 301 are respectively in the same layer and made of the same material as the gate insulating layer 420 and the interlayer insulating layer 430. A surface of each first protrusion 301 that is away from the substrate 100 is provided with a second protrusion 302 in contact with the first protrusion 301. The second protrusion 302 is a photoresist material. For example, in the manufacture process of the display substrate, after the gate insulating layer 420 is formed, a patterning process is performed to the gate insulating layer 420, so that a portion, in the non-display region 120, of the gate insulating layer 420 is formed as the first protrusion 301, and a photoresist material layer is coated on the substrate on which the first protrusion 301 is formed, and the second protrusion 302 is formed by exposing and developing. Correspondingly, the above processes may also be performed to the interlayer insulating layer 430. Therefore, a stack layer of two first protrusions 301 and two second protrusions 302 that are alternately arranged with each other may be formed on the substrate 100 of the non-display region 120, that is, the protrusion 300 as illustrated in FIG. 4 is formed.

For example, in at least one embodiment of the present disclosure, the protrusion 300 may also be separately disposed on the substrate 100 of the non-display region 120. For example, in at least one embodiment of the present disclosure, the preparing material of the protrusion 300 may comprises a photoresist material. Exemplarily, the photoresist material may be coated on the substrate 100 of the non-display region 120, the photoresist material is developed after being exposed through a mask, and the remaining portion of the photoresist material forms the protrusion 300. The process of the above manufacture method of the protrusion 300 is simple, and does not affect other structures in the display substrate.

In at least one embodiment of the present disclosure, the specific structure design of the protrusion 300 is not limited to the above several combinations, and may be designed according to actual requirements. At least one embodiment of the present disclosure does not limit the specific structure of the protrusion 300.

Figure 5:
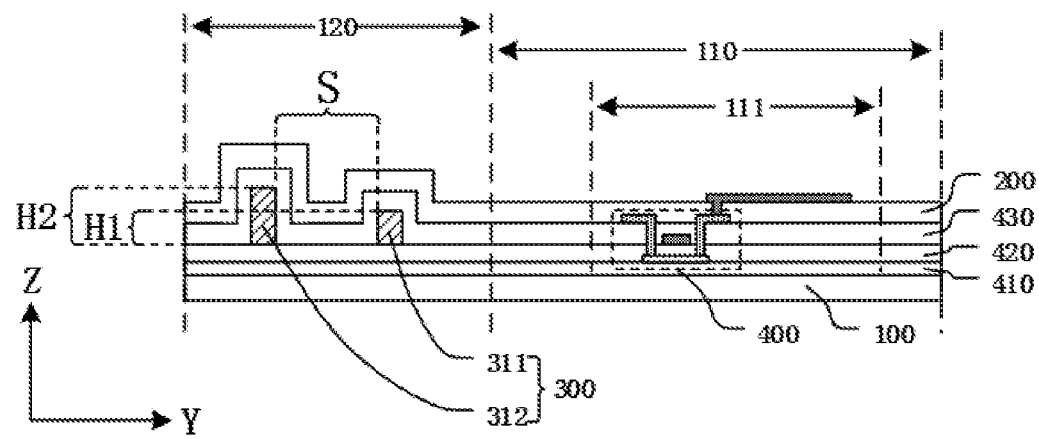
FIG. 5 is a partial cross-sectional view of another display substrate provided by an embodiment of the present disclosure.

For example, in at least one embodiment of the present disclosure, FIG. 5 is a partial cross-sectional view of another display substrate provided by an embodiment of the present disclosure. For example, as illustrated in FIG. 5, on a same layer parallel to the plane on which the substrate is disposed, the protrusion 300 at least comprises a first protrusion portion 311 and a second protrusion portion 312 that are sequentially disposed around the display region 110, the first protrusion portion 311 is disposed in the same layer as the second protrusion portion 312, and the first protrusion portion 311 is disposed inside the second protrusion portion 312. The multi-layer protrusion 300 can further increase the path of outside water and oxygen intruding into the interior of the display substrate, and further improve the package effect of the display substrate.

In at least one embodiment of the present disclosure, the relation of heights (the distance between one end of the protrusion 300 that is away from the substrate 100 and the other end of the protrusion 300 that is close to the substrate 100) of different protrusions 300 disposed in the same layer is not limited. For example, in at least one embodiment of the present disclosure, the height of the protrusion 300 in the outer layer of the display substrate may be set to be greater than the height of the protrusion 300 in the inner layer. Exemplarily, as illustrated in FIG. 5, the height H2 of the second protrusion 312 is greater than the height H1 of the first protrusion portion 311. The height H1 of the first protrusion portion 311 in the inner layer is relatively low, so as to avoid adversely affecting the structures in the display region 110, and the height H2 of the second protrusion portion 312 in the outer layer is relatively high, so as to increase the intruding path of water and oxygen, and improve the package effect of the display substrate.

In at least one embodiment of the present disclosure, a spacing distance between adjacent protrusions 300 disposed in the same layer is not limited. For example, in at least one embodiment of the present disclosure, the spacing distance between adjacent protrusions 300 (for example, the first protrusion portion 311 and second protrusion portion 312) is about 1 µm-20 µm, further about 3 µm-10 µm. Exemplarily, as illustrated in FIG. 5, the spacing distance S between the first protrusion portion 311 and the second protrusion portion 312 is about 3 µm-10 µm in a direction parallel to the plane on which the substrate 100 is disposed.

Figure 6:
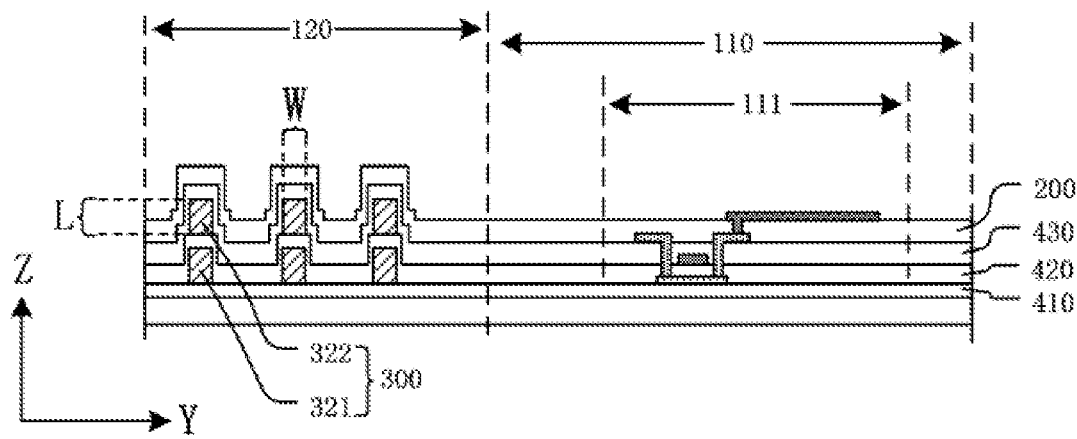
FIG. 6 is a partial cross-sectional view of another display substrate provided by an embodiment of the present disclosure.

For example, in at least one embodiment of the present disclosure, FIG. 6 is a partial cross-sectional view of another display substrate provided by an embodiment of the present disclosure. For example, as illustrated in FIG. 6, in the direction perpendicular to the plane on which the substrate 100 is disposed, the protrusion 300 at least comprises a first protrusion layer 321 and a second protrusion layer 322 that are in different layers, and the first protrusion layer 321 is located between the second protrusion layer 322 and the substrate 100. The arrangement of multi-layer protrusions 300 can further increase the path of water, oxygen, and so on intruding into the interior of the display substrate, and improve the package effect of the display substrate.

Exemplarily, as illustrated in FIG. 6, the first protrusion layer 321 may be disposed between the buffer layer 410 and the gate insulating layer 420, and the second protrusion layer 322 may be disposed between the gate insulating layer 420 and the interlayer insulating layer 430. For the situation where the protrusions 300 are disposed in different layers, at least one embodiment of the present disclosure does not limit the layer number, the specific position and the number of the protrusions 300, which may be set according to actual requirements.

At least one embodiment of the present disclosure does not limit the relative position relation between the protrusions 300 in different layers.

For example, in at least one embodiment of the present disclosure, as illustrated in FIG. 6, an orthographic projection of the first protrusion layer 321 on the substrate 100 coincides with an orthographic projection of the second protrusion layer 322 on the substrate 100, that is, the first protrusion layer 321 and the second protrusion layer 322 may be superposed.

For example, in at least one embodiment of the present disclosure, the orthographic projection of the first protrusion layer 321 on the substrate 100 is outside the orthographic projection of the second protrusion layer 322 on the substrate 100, that is, the first protrusion layer 321 and the second protrusion layer 322 may be staggered.

At least one embodiment of the present disclosure does not limit the size of the protrusion 300, which may be designed according to actual processes. For example, in at least one embodiment of the present disclosure, as illustrated in FIG. 2, a height H of the protrusion 300 may be about 0.2 µm-3 µm in the direction perpendicular to the plane on which the substrate 100 is disposed; a width W of the protrusion 300 may be about 3 µm-9 µm in the direction parallel to the plane on which the substrate 100 is disposed.

In at least one embodiment of the present disclosure, the arrangement manner of the protrusion 300 on the substrate 100 is not limited as long as the arrangement of the protrusion 300 can increase the path of water, oxygen, and so on intruding into the interior of the display substrate.

For example, in at least one embodiment of the present disclosure, as illustrated in FIG. 1, the protrusion 300 is disposed in an annular structure and surrounds the display region 110, and the protrusion 300 may be partially disposed around the display region 110, alternatively, the protrusion 300 may be disposed in an annular structure and surrounds the display region 110, and each protrusion 300 may be disposed in an integrated closed annular structure. Therefore, the protrusion 300 can protect components in the whole display region 110.

Figure 7:
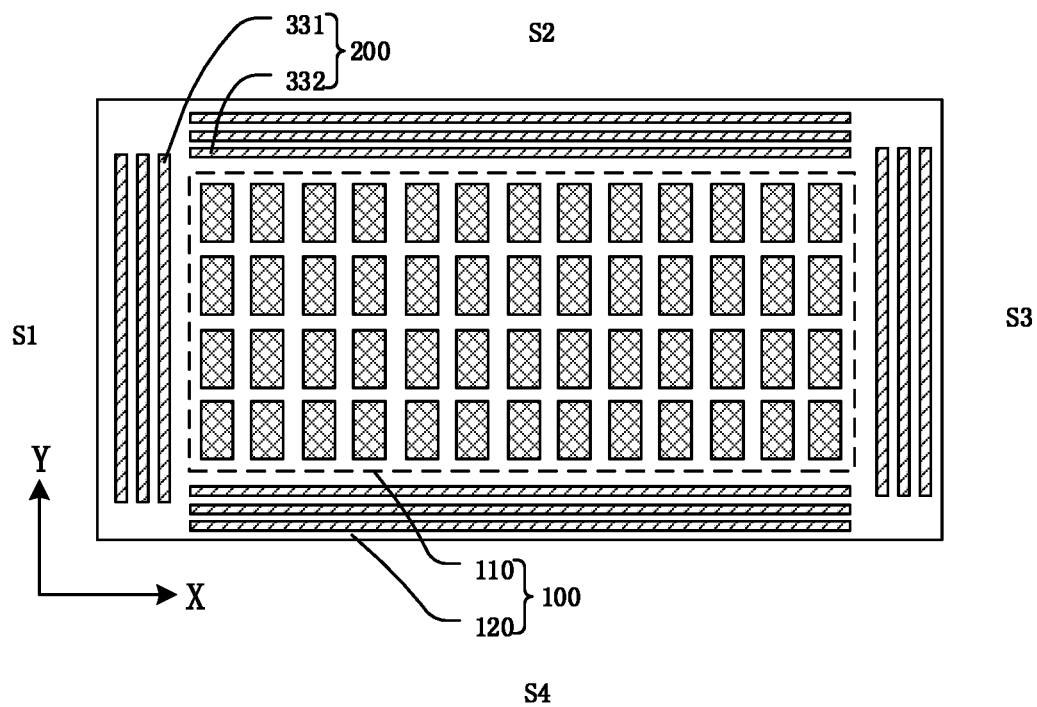
FIG. 7 is a plan view of another display substrate provided by an embodiment of the present disclosure.

For example, in at least one embodiment of the present disclosure, FIG. 7 is a plan view of another display substrate provided by an embodiment of the present disclosure. As illustrated in FIG. 7, the protrusion 300 is disposed in the annular structure and disposed around the display region 110, and each protrusion 300 may be configured to comprise at least two protrusion segments 330 that are spaced apart from each other (for example, comprise a first protrusion segment 331, a second protrusion segment 332, and so on). The protrusion segments 330 may be disposed according to the specific structure of the display substrate, so as to avoid the display substrate from being too thick to cause poor subsequent manufacture processes and so on.

At least one embodiment of the present disclosure does not limit the length of the protrusion segment 330, which may be designed according to actual process conditions. For example, as illustrated in FIG. 7, on a same side of the display substrate, a ratio of the length of the protrusion segment 330 to a side length of the display substrate is not less than ⅓, further not less than ⅔. Exemplarily, for example, as illustrated in FIG. 7, on the S1 side of the display substrate, the ratio of the length of the first protrusion segment 331 extending in a direction parallel to the Y direction to the side length of the S1 side of the display substrate is not less than ⅓. On the S2 side of the display substrate, the ratio of the length of the second protrusion segment 332 extending in a direction parallel to the X direction to the side length of the S2 side of the display substrate is not less than ⅓. Similarly, on the S3, S4 sides of the display substrate, the ratio of the length of the protrusion segment 330 to the side length of the display substrate is not less than ⅓.

At least one embodiment of the present disclosure does not limit an extending shape of the protrusion 300 on the display substrate. For example, as viewed in a direction parallel to the Z-axis, the extending shape (excluding the extending shape of the bent portion) of the protrusion 300 (for example, the protrusion segment 330) in a plane parallel to the plane on which the substrate 100 is disposed may be a linear shape, a wavy shape, or the like. Exemplarily, as illustrated in FIG. 7, the extending shape of the first protrusion segment 331 in the direction parallel to the Y-axis direction or the extending shape of the second protrusion segment 332 in the direction parallel to the X-axis is the linear shape.

In at least one embodiment of the present disclosure, the type of display substrate is not limited. For example, in some embodiments of the present disclosure, the display substrate may be an array substrate for a liquid crystal display. For example, in other embodiments of the present disclosure, the display substrate may be an array substrate for an organic light emitting diode (OLED) display.

In at least one embodiment of the present disclosure, the arrangement manner of the protrusion 300 may be adjusted correspondingly for different types of display substrates, alternatively, the structure of other components in the display substrate may be adjusted to cooperate with the protrusion 300, thereby further improving the package effect of the display substrate. In the following, the structure of the display substrate will be further described by taking the display substrate being an OLED array substrate as an example.

Figure 8:
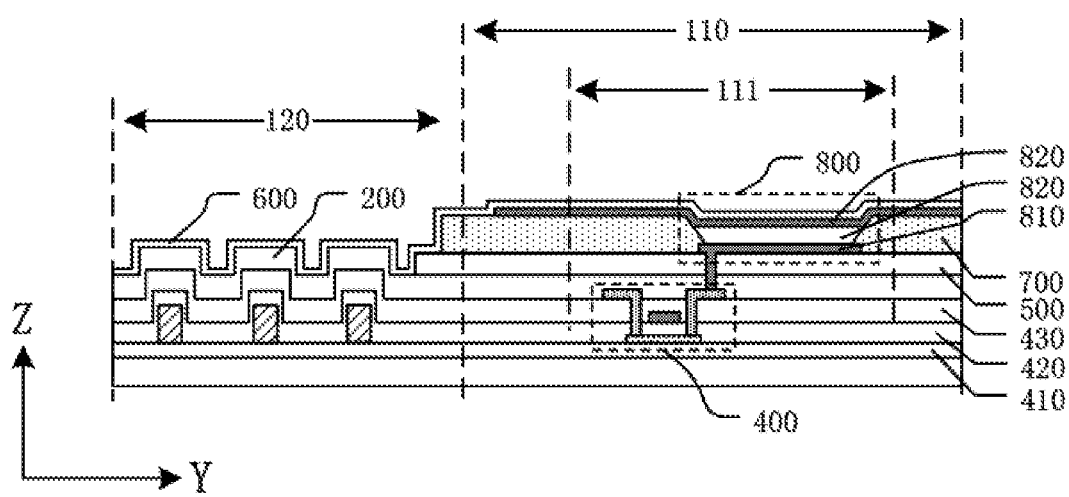
FIG. 8 is a partial cross-sectional view of another display substrate provided by an embodiment of the present disclosure.

For example, in at least one embodiment of the present disclosure, FIG. 8 is a partial cross-sectional view of another display substrate provided by an embodiment of the present disclosure. As illustrated in FIG. 8, the display substrate may comprise an encapsulation layer 600 disposed on a side of the passivation layer 200 that is away from the substrate 100, and at least one organic light emitting member 800 is disposed on the substrate 100 of each of the pixel regions 111, the organic light emitting member 800 is between the encapsulation layer 600 and the passivation layer 200. The distribution of the pixel regions 111 may be referred to the related content illustrated in FIG. 1. The arrangement of the protrusion 300 can prevent water, oxygen, and so on from intruding into the organic light emitting member 800 from a region between the substrate 100 and the passivation layer 200, thereby protecting the organic light emitting member.

For example, in at least one embodiment of the present disclosure, as illustrated in FIG. 8, the organic light emitting member 800 may comprise a first electrode 810, an organic light emitting layer 820, and a second electrode 620, and the organic light emitting layer 820 is between the first electrode 810 and the second electrodes 830. The source-drain electrode layer in the thin film transistor 400 may be electrically connected to the first electrode 810 in the organic light emitting member 800 to drive the organic light emitting member 800. The structure of the organic light emitting member 800 is not limited to the above content, for example, the organic light emitting member 800 may further comprise structures such as a hole injection layer, a hole transport layer, an electron transport layer, an electron injection layer, or the like between the first electrode 810 and the second electrode 830, and may further comprise a hole blocking layer and an electron blocking layer, and the hole blocking layer may be disposed, for example, between the electron transport layer and the organic light emitting layer 820, and the electron blocking layer may be disposed, for example, between the hole transport layer and the organic light emitting layer 820.

At least one embodiment of the present disclosure does not limit preparing materials of the first electrode 810 and the second electrode 830 in the organic light emitting member 800. For example, in at least one embodiment of the present disclosure, one of the first electrode 810 and the second electrode 830 may be an anode and the other may be a cathode. The anode may be formed of, for example, a transparent conductive material having a high work function, and the electrode material may comprise indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, or the like. The cathode may be formed of, for example, a material having high conductivity and a low work function, and the electrode material may comprise alloys such as magnesium aluminum alloy (MgAl), lithium aluminum alloy (LiAl)) or the like, or mono-metals such as magnesium, aluminum, lithium, silver and the like.

At least one embodiment of the present disclosure does not limit the preparing material of the organic light emitting layer 820 in the organic light emitting member 800. For example, in at least one embodiment of the present disclosure, the material of the organic light emitting layer 820 may be selected according to the color of the emitted light. For example, the preparing material of the organic light emitting layer 820 comprises a fluorescent luminescent material or a phosphorescent material. For example, in at least one embodiment of the present disclosure, the organic light emitting layer 820 may adopt a doping system, that is, a usable luminescent material is obtained by mixing a dopant material into a host luminescent material. For example, the host luminescent material may adopt a metal compound material, a derivative of anthracene, an aromatic diamine compound, a triphenylamine compound, an aromatic triamine compound, a biphenyldiamine derivative, or a triarylamine polymer and the like.

At least one embodiment of the present disclosure does not limit the preparing material and the specific structure of the encapsulation layer 600. For example, the encapsulation layer 600 may be a single layer structure or a composite structure of at least two layers. For example, the preparing material of the encapsulation layer 600 may comprise an insulating material such as silicon nitride (SiNx), silicon oxide (SiOx), silicon oxynitride (SiNxOy), polymer resin or the like.

At least one embodiment of the present disclosure does not limit the distribution range of the encapsulation layer 600 on the substrate 100. For example, in at least one embodiment of the present disclosure, the orthographic projection of the protrusion 300 on the substrate 100 is within an orthographic projection of the encapsulation layer 600 on the substrate 100, that is, the encapsulation layer 600 extends to a region in which the protrusion 300 is disposed. For example, in at least one embodiment of the present disclosure, the orthographic projection of the protrusion 300 on the substrate 100 is outside the orthographic projection of the encapsulation layer 600 on the substrate 100. The distribution of the encapsulation layer 600 on the substrate 100 is related to the subsequent package structure of the display substrate. The different arrangement manners of the encapsulation layer 600 may be referred to the related content in the following embodiments (such as the embodiment of the display panel illustrated in FIG. 12). At least one embodiment of the present disclosure does not describe here.

For example, in at least one embodiment of the present disclosure, as illustrated in FIG. 8, the display substrate may further comprise a pixel definition layer 700 on the substrate 100, and the organic light emitting member 800 is disposed in a region defined by the pixel definition layer 700.

At least one embodiment of the present disclosure does not limit the specific structure, the preparing material, and so on of the pixel definition layer 700. For example, in at least one embodiment of the present disclosure, the pixel definition layer 700 may be a one-layer structure, a double-layer structure, or may be a multi-layer composite layer structure. For example, the pixel definition layer 700 may at least comprise a stack layer of a first definition layer and a second definition layer. The first definition layer may be formed of, for example, a hydrophilic organic material, and the second definition layer may be formed of, for example, a hydrophobic organic material. The first definition layer is between the substrate 100 and the second definition layer. When a partial structure of the organic light emitting member 800 (for example, the organic light emitting layer 820 or the like) is formed by, for example, inkjet printing, the first definition layer having hydrophilic properties adsorbs and fixes the inkjet material in the region defined by the pixel definition layer 700, and the second definition layer having hydrophobic properties causes the inkjet material falling thereon to slide down and move to the region defined by the pixel definition layer 700, thereby improving the yield of the display substrate.

For example, in at least one embodiment of the present disclosure, as illustrated in FIG. 8, the display substrate may further comprise a planarization layer 500 between the organic light emitting member 800 and the passivation layer 200. In the manufacture process of the display substrate, the planarization layer 500 may planarize the display substrate to facilitate subsequent processes. At least one embodiment of the present disclosure does not limit the preparing material of the planarization layer 500. For example, the preparing material of the planarization layer 500 may be an organic material such as epoxy resin, polyimide, polyamide, acrylic, or other suitable materials.

In at least one embodiment of the present disclosure, the arrangement manner of the protrusion is not limited to increasing the path of water, oxygen, and so on intruding into the interior of the display substrate along the surface of the passivation layer.

Figure 9:
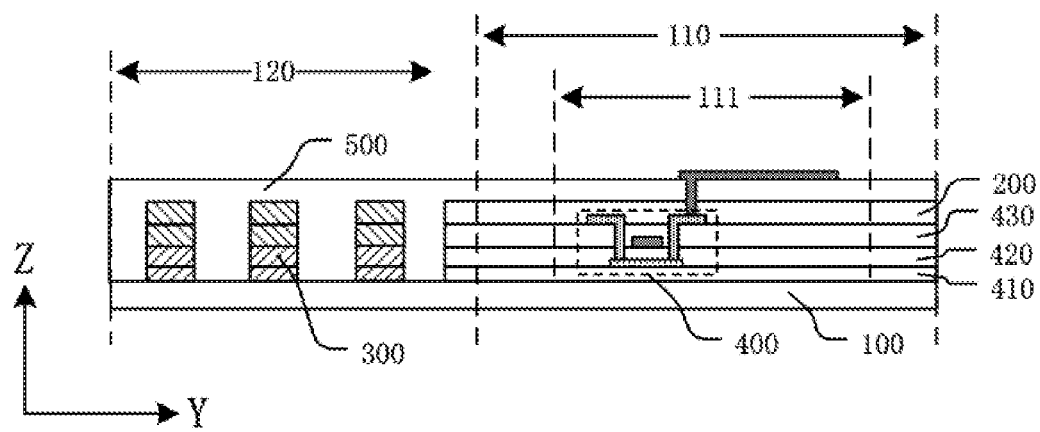
FIG. 9 is a partial cross-sectional view of another display substrate provided by an embodiment of the present disclosure.

For example, in at least one embodiment of the present disclosure, FIG. 9 is a partial cross-sectional view of another display substrate provided by an embodiment of the present disclosure. For example, as illustrated in FIG. 9, the display substrate may comprise at least one of a buffer layer 410, a gate insulating layer 420, an interlayer insulating layer 430, a passivation layer 200, and a planarization layer 500 that are sequentially disposed on the substrate 100. The arrangement selection of the buffer layer 410, the gate insulating layer 420, the interlayer insulating layer 430, the passivation layer 200, and the planarization layer 500 may be designed according to actual requirements, and at least one embodiment of the present disclosure does not limit this. In the following, contents of the following embodiment of the present disclosure will be described by taking the buffer layer 410, the gate insulating layer 420, the interlayer insulating layer 430, the passivation layer 200, and the planarization layer 500 being simultaneously disposed in the display substrate as an example.

For example, in at least one embodiment of the present disclosure, as illustrated in FIG. 9, at least a portion of the protrusion 300 is configured to be in the same layer and made of the same material as the interlayer insulating layer 430; and/or at least a portion of the protrusion 300 is configured to be in the same layer and made of the same material as the gate insulating layer 420; and/or at least a portion of the protrusion 300 is configured to be in the same layer and made of the same material as the buffer layer 410; and/or at least a portion of the protrusion 300 is configured to be in the same layer and made of the same material as the passivation layer 200. For example, the orthographic projection of the protrusion 300 on the substrate 100 is within the orthographic projection of the planarization layer 500 on the substrate 100. Exemplarily, in the manufacture process of the display substrate, the buffer layer 410, the gate insulating layer 420, the interlayer insulating layer 430, and the passivation layer 200 may be sequentially formed on the substrate 100, and then a patterning process is performed to the buffer layer 410, the gate insulating layer 420, the interlayer insulating layer 430, and the passivation layer 200 in the non-display region 120, so that portions, in the non-display region 120, of the buffer layer 410, the gate insulating layer 420, the interlayer insulating layer 430, and the passivation layer 200 form the protrusion 300, and then the substrate 100 is covered with the planarization layer 500. The protrusion 300 not only can increase the path of water, oxygen, and so on intruding into the interior of the display substrate, but also can reduce the probability of damage such as cracking, and reduce the risk of outside water, oxygen, and so on intruding into the interior of the display substrate in the application process (for example, the display substrate may be a flexible display substrate, and operations such as bending and so on are performed to the display substrate in the application process) of the display substrate.

Figure 10:
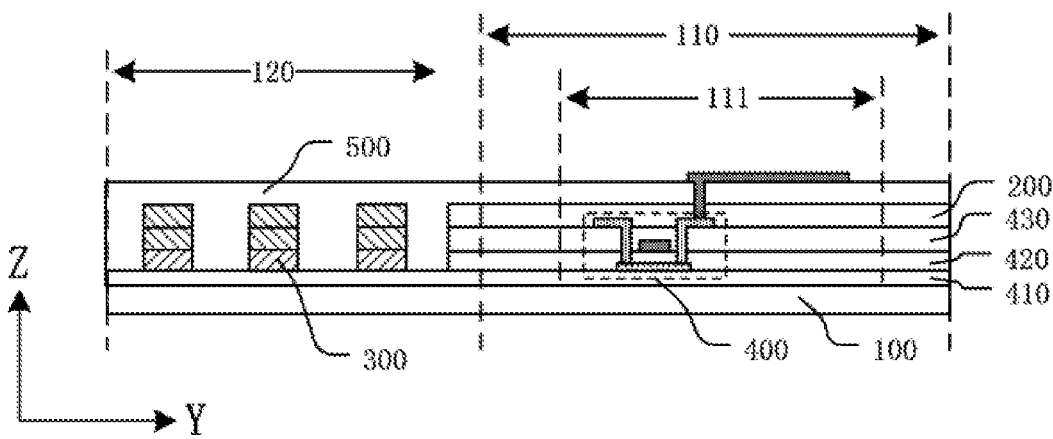
FIG. 10 is a partial cross-sectional view of another display substrate provided by an embodiment of the present disclosure.

For example, in at least one embodiment of the present disclosure, FIG. 10 is a partial cross-sectional view of another display substrate provided by an embodiment of the present disclosure. For example, as illustrated in FIG. 10, the display substrate comprises a buffer layer 410, a gate insulating layer 420, an interlayer insulating layer 430, a passivation layer 200, and a planarization layer 500 on the substrate 100. As illustrated in FIG. 10, at least a portion of the protrusion 300 is configured to be in the same layer and made of the same material as the interlayer insulating layer 430; and/or at least a portion of the protrusion 300 is configured to be in the same layer and made of the same material as the gate insulating layer 420; and/or at least a portion of the protrusion 300 is configured to be in the same layer and made of the same material as the passivation layer 200. For example, in the direction parallel to the Z-axis, the orthographic projection of the protrusion 300 on the substrate 100 is within the orthographic projection of the buffer layer 410 on the substrate 100, and the orthographic projection of the protrusion 300 on the substrate 100 is within the orthographic projection of the planarization layer 500 on the substrate 100.

Exemplarily, in the manufacture process of the display substrate, the buffer layer 410, the gate insulating layer 420, the interlayer insulating layer 430, and the passivation layer 200 are sequentially formed on the substrate 100, and then a patterning process is performed to portions, in the non-display region 120, of the gate insulating layer 420, the interlayer insulating layer and the passivation layer 430, so that the portions, in the non-display region 120, of the gate insulating layer 420, the interlayer insulating layer 430 and the passivation layer 200 form the protrusion 300, and then the substrate 100 is covered by the planarization layer 500. The buffer layer 410 extends to the non-display region 120 of the substrate 100, for example, extends to the region in which the protrusion 300 is disposed, thereby having a buffer function between the substrate 100 and the structures disposed on the substrate 100, and protecting the structures on the substrate 100. Therefore, the protrusion 300 not only can increase the path of water, oxygen, and so on intruding into the interior of the display substrate, but also can reduce the probability of damage such as cracking, and reduce the risk of outside water, oxygen, and so on intruding into the interior of the display substrate in the application process (for example, the display substrate may be a flexible display substrate, and operations such as bending and so on are performed on the display substrate in the application process) of the display substrate.

Figure 11:
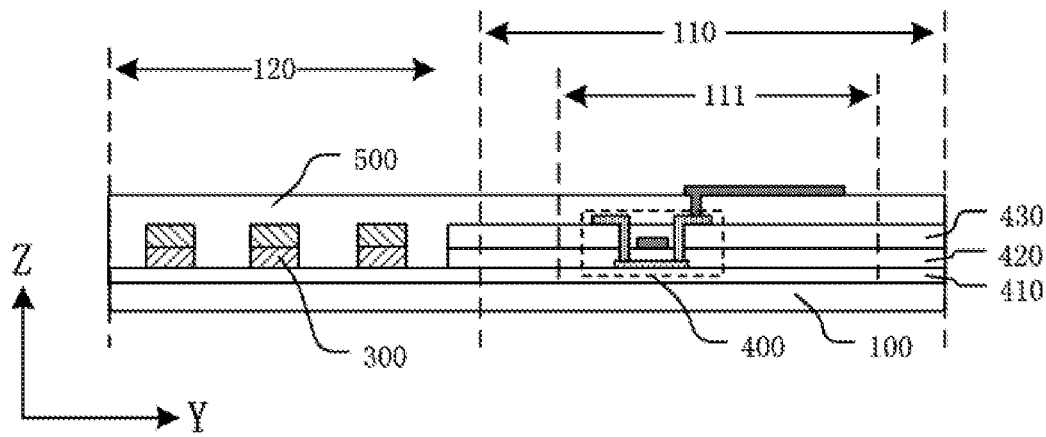
FIG. 11 is a partial cross-sectional view of another display substrate provided by an embodiment of the present disclosure.

For example, in at least one embodiment of the present disclosure, FIG. 11 is a partial cross-sectional view of another display substrate provided by an embodiment of the present disclosure. For example, as illustrated in FIG. 11, the display substrate comprises a buffer layer 410, a gate insulating layer 420, an interlayer insulating layer 430, and a planarization layer 500 on the substrate 100. As illustrated in FIG. 11, at least a portion of the protrusion 300 is configured to be in the same layer and made of the same material as the interlayer insulating layer 430; and/or at least a portion of the protrusion 300 is configured to be in the same layer and made of the same material as the gate insulating layer 420. For example, in the direction parallel to the Z-axis, the orthographic projection of the protrusion 300 on the substrate 100 is within the orthographic projection of the buffer layer 410 on the substrate 100, and the orthographic projection of the protrusion 300 on the substrate 100 is within the orthographic projection of the planarization layer 500 on the substrate 100.

Exemplarily, in the manufacture process of the display substrate, the buffer layer 410, the gate insulating layer 420, the interlayer insulating layer 430 are sequentially formed on the substrate 100, and then a patterning process is performed to portions, in the non-display region 120, of the gate insulating layer 420 and the interlayer insulating layer 430, so that the portions, in the non-display region 120, of the gate insulating layer 420 and the interlayer insulating layer 430 form the protrusion 300, and then the substrate 100 is covered by the planarization layer 500. Therefore, the protrusion 300 in the display substrate not only can increase the path of water, oxygen, and so on intruding into the interior of the display substrate, but also can reduce the probability of damage such as cracking, and reduce the risk of outside water, oxygen, and so on intruding into the interior of the display substrate in the application process (for example, the display substrate may be a flexible display substrate, and operations such as bending and so on are performed on the display substrate in the application process) of the display substrate. Besides, the passivation layer 200 as illustrated in FIG. 10 is not disposed in the display substrate, and the planarization layer 500 replaces the passivation layer 200, and therefore the thickness of the display substrate can be further reduced, which facilitate the lightening and thinning of the display substrate. Further, the buffer layer 410 extends to the non-display region 120 of the substrate 100, for example, extends to the region in which the protrusion 300 is disposed, thereby having a buffer function between the substrate 100 and the structures disposed on the substrate 100, and protecting the structures on the substrate 100.

In at least one embodiment of the present disclosure, a plurality of layers of protrusions 300 may be disposed around the display region 110 of the display substrate, so that water, oxygen, and so on may be blocked by the plurality of layers of protrusions 300 during the process of water, oxygen, and so on intruding into the display substrate, which further increase the package effect of the protrusion 300 on the display substrate.

For example, in at least one embodiment of the present disclosure, as illustrated in FIG. 11, at least two protrusions 300 may be disposed on the same side of the display region 110 of the display substrate. For example, the height of the protrusion 300 is about 0.2 µm-3 µm in the direction perpendicular to the plane on which the substrate 100 is disposed; the width of the protrusion 300 is about 3 µm-9 µm in the direction parallel to the plane on which the substrate 100 is disposed; and in the direction parallel to the plane on which the substrate 100 is disposed, the spacing distance between two adjacent protrusions 300 is about 3 µm-10 µm. The size of the protrusion 300 may be referred to the related content in the above embodiment (for example, the embodiment illustrated in FIG. 5), and at least one embodiment of the present disclosure does not describe here.

At least one embodiment of the present disclosure provides a display panel, the display panel comprises the display substrate in any one of the above embodiments. At least one embodiment of the present disclosure does not limit the type of the display panel.

For example, in an example of the embodiment of the present disclosure, the display panel may be a liquid crystal display panel, for example, the display substrate is served as an array substrate of the liquid crystal display panel, and the display panel may further comprise a color filter substrate that is cell-assembled with the array substrate, the array substrate and color filter substrate are disposed oppositely to each other to form a liquid crystal cell, and the liquid crystal cell is filled with liquid crystal materials. The pixel electrode and the common electrode of each pixel unit of the array substrate are used to apply an electric field to control the rotation degree of the liquid crystal materials, so as to perform display operations.

For example, in an example of the embodiment of the present disclosure, the display panel may be an organic light emitting diode (OLED) display panel, a stack layer of organic light emitting materials may be formed in a sub-pixel region of the display panel, and the pixel electrode of each pixel unit serves as an anode or a cathode to drive the organic light emitting material to emit light, so as to perform display operations.

For example, in an example of the embodiment of the present disclosure, the display panel may be an electronic paper display panel, an electronic ink layer may be formed on the display substrate of the display panel, and the pixel electrode of each pixel unit is used to apply a voltage that drives charged microparticles in the electronic ink to move to perform display operations.

In the following, the specific structure of the display panel in the embodiment of the present disclosure will be described by taking the display panel being the OLED display panel and the display substrate in the display panel being the OLED array substrate as an example.

Figure 12:
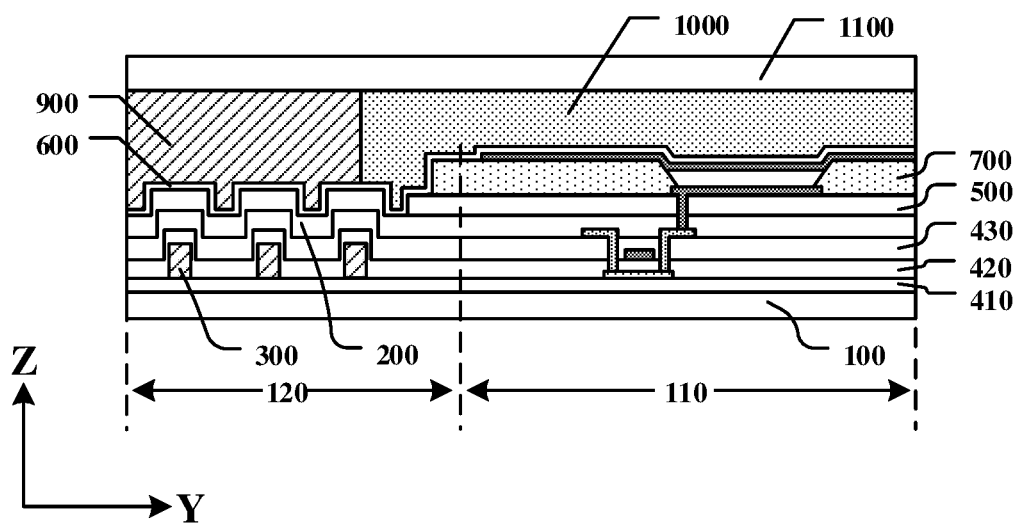
FIG. 12 is a partial cross-sectional view of a display panel provided by an embodiment of the present disclosure.

FIG. 12 is a partial cross-sectional view of a display panel provided by an embodiment of the present disclosure. For example, in at least one embodiment of the present disclosure, as illustrated in FIG. 12, the display panel may further comprise an opposite substrate 1100 that is cell-assembled with the substrate 100, and a sealant 900, a filling layer 1000, and so on that are disposed between the opposite substrate 1100 and the substrate 100.

For example, in at least one embodiment of the present disclosure, as illustrated in FIG. 12, in the direction parallel to the Z-axis, the sealant 900 may be disposed to cover a region where the protrusion 300 is located. The sealant 900 may connect the display substrate and the opposite substrate 1100, and package the display panel to prevent outside substances from intruding into the interior of the display panel.

For example, in at least one embodiment of the present disclosure, as illustrated in FIG. 12, the encapsulation layer 600 may be, for example, in contact with the sealant 900, that is, the orthographic projection of the protrusion 300 on the substrate 100 is within the orthographic projection of the encapsulation layer 600 on the substrate 100. In the region where the protrusion 300 is disposed, the encapsulation layer 600 is also formed with an uneven portion corresponding to the protrusion 300, so that the contact area of the sealant 900 and the encapsulation layer 600 in the region is increased, which not only increase the path of water, oxygen, and so on intruding into the interior of the display panel along the interface between the sealant 900 and the encapsulation layer 600, but also improve the firmness of the connection between the sealant 900 and the encapsulation layer 600, and improve the package effect of the display panel.

For example, in at least one embodiment of the present disclosure, the encapsulation layer 600 is not in contact with the sealant 900, that is, the orthographic projection of the protrusion 300 on the substrate 100 is within the orthographic projection of the encapsulation layer 600 on the substrate 100. In the region where the protrusion 300 is disposed, the passivation layer 200 is also formed with an uneven portion corresponding to the protrusion 300, so that the contact area of the sealant 900 and the passivation layer 200 in the region is increased, which not only increase the path of water, oxygen, and so on intruding into the interior of the display panel along the interface between the sealant 900 and the encapsulation layer 600, but also improve the firmness of the connection between the sealant 900 and the encapsulation layer 600, and improve the package effect of the display panel.

At least one embodiment of the present disclosure does not limit the preparing material of the sealant 900. For example, the preparing material of the sealant 900 may comprise an organic material, an inorganic material, or a combination of the organic material and the inorganic material. The organic material may comprise epoxy resin, polyurethane, organic silicone, acrylate, polysiloxane, polyamide, polyester, or a combination of the above materials, and the inorganic material may comprise water glass and so on.

After the opposite substrate 1100 and the display substrate are bonded oppositely, the sealant 900 is cured (for example, ultraviolet irradiation cured or heat cured, etc.) to complete the package of the display panel. For example, the sealant 900 may also be cured by pressing, melting, cooling, reaction curing, or a combination thereof. The material cured by pressing may comprise a pressure sensitive adhesive. The material cured by melting and cooling may comprise a hot melt adhesive such as polyolefin, polyester, polyamide or the like. The material cured by reaction curing may comprise acrylate, epoxy resin, polyurethane, polysiloxane, or a combination thereof, and the reaction curing may comprise heat curing, ultraviolet radiation curing, or the like.

At least one embodiment of the present disclosure does not limit the preparing material of the filling layer 1000. For example, the material of the filling layer 1000 may be a polymer material containing a desiccant or a polymer material that can block moisture, such as a polymer resin or the like, the material of the filling layer 1000 may also be a water-absorbent material, for example, an alkali metal (such as Li, Na), an alkaline earth metal (such as Ba, Ca) or other moisture reactive metals (such as Al, Fe); the material of the filling layer 1000 may also be an alkali metal oxide (such as $Li_2O$, $Na_2O$), an alkaline earth metal oxide (such as MgO, CaO, BaO), sulfate (such as anhydrous $MgSO_4$), metal halide (such as $CaCl_2$), perchlorate (such as $Mg(ClO_4)_2$), or the like.

It should be noted that, in at least one embodiment of the present disclosure, the OLED display panel may not be provided with structures such as the sealant 900, the filling layer 1000, the opposite substrate 1100 and so on, for example, the package of the OLED display panel may be completed only by the encapsulation layer 600.

For example, in at least one embodiment of the present disclosure, the display substrate in the display panel may be a flexible substrate to be applied to the field of flexible display. For example, in the display panel provided by the embodiments of the present disclosure, a touch substrate may be disposed on the display substrate to enable the display panel to obtain a touch display function.

For example, in at least one embodiment of the present disclosure, the display panel may be any product or component having a display function such as a television, a digital camera, a mobile phone, a watch, a tablet, a notebook computer, a navigator, or the like.

It should be noted that not all structures of the display panel are described, for clarity. In order to realize the necessary functions of the display panel, other structures may be disposed by those skilled in the art according to specific application scenarios, which is not limited in the present disclosure.

At least one embodiment of the present disclosure provides a manufacture method of a display substrate, which comprises: providing a substrate, the substrate comprising a display region and a non-display region around the display region; and forming at least one protrusion on the substrate. The protrusion is formed in the non-display region. In the display substrate obtained by the above manufacture method, in the non-display region of the display substrate, the arrangement of the protrusion increases the path of outside water, oxygen, and so on intruding into the interior of the display substrate, and protects the components in the display substrate.

For example, the manufacture method of a display substrate provide by at least one embodiment of the present disclosure further comprises: forming a passivation layer on the substrate. The protrusion is formed between the substrate and the passivation layer, and the passivation layer at least partially covers the protrusion. Therefore, in the display substrate obtained by the above manufacture method, the protrusion can increase the path of water, oxygen, and so on intruding into the interior of the display substrate along the surface of the passivation layer, and protect the components in the display substrate.

For example, the manufacture method of a display substrate provide by at least one embodiment of the present disclosure further comprises: forming a planarization layer on the substrate; and forming at least one of a buffer layer, a gate insulating layer, an interlayer insulating layer and a passivation layer between the substrate and the planarization layer. An orthographic projection of the protrusion on the substrate is within an orthographic projection of the planarization layer on the substrate, at least a portion of the protrusion is configured to be in a same layer and made of a same material as the interlayer insulating layer; and/or at least a portion of the protrusion is configured to be in a same layer and made of a same material as the gate insulating layer; and/or at least a portion of the protrusion is configured to be in a same layer and made of a same material as the buffer layer; and/or at least a portion of the protrusion is configured to be in a same layer and made of a same material as the passivation layer. Therefore, in the display substrate obtained by the above manufacture method, the protrusion not only can increase the path of water, oxygen, and so on intruding into the interior of the display substrate, but also can reduce the probability of damage such as cracking, and reduce the risk of outside water, oxygen, and so on intruding into the interior of the display substrate in the application process (for example, the display substrate may be a flexible display substrate, and operations such as bending and so on are performed on the display substrate in the application process) of the display substrate.

For example, the manufacture method of a display substrate provide by at least one embodiment of the present disclosure further comprises: forming a buffer layer, a gate insulating layer, an interlayer insulating layer, a passivation layer and a planarization layer on the substrate. An orthographic projection of the protrusion on the substrate is within an orthographic projection of the planarization layer on the substrate, and an orthographic projection of the protrusion on the substrate is within an orthographic projection of the buffer layer on the substrate, and at least a portion of the protrusion is configured to be in a same layer and made of a same material as the interlayer insulating layer; and/or at least a portion of the protrusion is configured to be in a same layer and made of a same material as the gate insulating layer; and/or at least a portion of the protrusion is configured to be in a same layer and made of a same material as the passivation layer. Therefore, in the display substrate obtained by the above manufacture method, the protrusion not only can increase the path of water, oxygen, and so on intruding into the interior of the display substrate, but also can reduce the probability of damage such as cracking, and reduce the risk of outside water, oxygen, and so on intruding into the interior of the display substrate in the application process (for example, the display substrate may be a flexible display substrate, and operations such as bending and so on are performed on the display substrate in the application process) of the display substrate.

For example, the manufacture method of a display substrate provide by at least one embodiment of the present disclosure further comprises: forming a buffer layer, a gate insulating layer, an interlayer insulating layer and a planarization layer on the substrate. An orthographic projection of the protrusion on the substrate is within an orthographic projection of the planarization layer on the substrate, and an orthographic projection of the protrusion on the substrate is within an orthographic projection of the buffer layer on the substrate, and at least a portion of the protrusion is configured to be in a same layer and made of a same material as the interlayer insulating layer; and/or at least a portion of the protrusion is configured to be in a same layer and made of a same material as the gate insulating layer. Therefore, in the display substrate obtained by the above manufacture method, the protrusion not only can increase the path of water, oxygen, and so on intruding into the interior of the display substrate, but also can reduce the probability of damage such as cracking, and reduce the risk of outside water, oxygen, and so on intruding into the interior of the display substrate in the application process (for example, the display substrate may be a flexible display substrate, and operations such as bending and so on are performed on the display substrate in the application process) of the display substrate. Besides, the passivation layer is not formed in the display substrate, and therefore the thickness of the display substrate can be further reduced, which facilitate the lightening and thinning of the display substrate. Further, the buffer layer extends to the non-display region of the substrate, thereby having a buffer function between the substrate and the structures formed on the substrate, and protecting the structures formed on the substrate.

At least one embodiment of the present disclosure provides a display substrate and a manufacture method thereof, and a display panel, which may have at least one of the following effects:

(1) In the display substrate provided by at least one embodiment of the present disclosure, the protrusion disposed in the non-display region can increase the path of water, oxygen, and so on intruding into the interior of the display substrate, and improve the package effect of the display substrate.

(2) In the display substrate provided by at least one embodiment of the present disclosure, the protrusion can also increase the firmness of the connection between each of the layer structures (for example, the passivation layer and the interlayer insulating layer) in the display substrate, and improve the package effect of the display substrate.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a region may be enlarged or reduced, that is, the drawings are not drawn according to the actual scale.

(3) In case of no conflict, features in one embodiment or in different embodiments can be combined to obtain new embodiments.

What are described above is related to the illustrative embodiments of the disclosure only and not limitative to the scope of the disclosure; the scopes of the disclosure are defined by the accompanying claims.

What is claimed is:

1. A display substrate, comprising:
    a substrate, comprising a display region and a non-display region around the display region;
    at least one protrusion on the substrate;
    a passivation layer on the substrate; and
    an encapsulation layer, disposed on a side of the passivation layer that is away from the substrate,
    wherein the protrusion is in the non-display region,
    the protrusion is between the substrate and the passivation layer, and at least a portion of the passivation layer covers the protrusion,
    the substrate of the display region comprises a plurality of pixel regions, at least one organic light emitting member is disposed on the substrate of each of the pixel regions, and the organic light emitting member is between the passivation layer and the encapsulation layer.

2. The display substrate according to claim 1, wherein an orthographic projection of the protrusion on the substrate is within an orthographic projection of the encapsulation layer on the substrate.

3. A manufacture method of a display substrate according to claim 1, comprising:
    providing a substrate, the substrate comprising a display region and a non-display region around the display region; and
    forming at least one protrusion on the substrate;
    wherein the protrusion is formed in the non-display region.

4. The display substrate according to claim 1, wherein the protrusion is disposed in an annular structure and surrounds the display region,
    the protrusion is disposed in an integrated closed annular structure; or,
    the protrusion is disposed to comprise at least two protrusion segments that are spaced apart from each other.

5. The display substrate according to claim 1, further comprising:
    a buffer layer, a gate insulating layer, an interlayer insulating layer, a passivation layer and a planarization layer on the substrate;
    wherein at least a portion of the protrusion is configured to be in a same layer and made of a same material as the interlayer insulating layer; and/or
    at least a portion of the protrusion is configured to be in a same layer and made of a same material as the gate insulating layer; and/or
    at least a portion of the protrusion is configured to be in a same layer and made of a same material as the passivation layer;
    an orthographic projection of the protrusion on the substrate is within an orthographic projection of the planarization layer on the substrate, and an orthographic projection of the protrusion on the substrate is within an orthographic projection of the buffer layer on the substrate.

6. The display substrate according to claim 1, further comprising:
    a buffer layer, a gate insulating layer, an interlayer insulating layer and a planarization layer on the substrate;
    wherein at least a portion of the protrusion is configured to be in a same layer and made of a same material as the interlayer insulating layer; and/or
    at least a portion of the protrusion is configured to be in a same layer and made of a same material as the gate insulating layer;
    an orthographic projection of the protrusion on the substrate is within an orthographic projection of the planarization layer on the substrate, and an orthographic projection of the protrusion on the substrate is within an orthographic projection of the buffer layer on the substrate.

7. A display panel, comprising the display substrate according to claim 1.

8. The display substrate according to claim 1, further comprising:
    at least one of a buffer layer, a gate insulating layer, an interlayer insulating layer, a passivation layer and a planarization layer on the substrate,
    wherein at least a portion of the protrusion is configured to be in a same layer and made of a same material as the interlayer insulating layer; and/or
    at least a portion of the protrusion is configured to be in a same layer and made of a same material as the gate insulating layer; and/or
    at least a portion of the protrusion is configured to be in a same layer and made of a same material as the buffer layer; and/or
    at least a portion of the protrusion is configured to be in a same layer and made of a same material as the passivation layer; and
    an orthographic projection of the protrusion on the substrate is within an orthographic projection of the planarization layer on the substrate.

9. The display substrate according to claim 8, wherein
    a height of the protrusion is 0.2 μm-3 μm in a direction perpendicular to a plane on which the substrate is disposed;
    a width of the protrusion is 3 μm-9 μm in a direction parallel to the plane on which the substrate is disposed; and
    a spacing distance between two adjacent protrusions is 3 μm-10 μm in the direction parallel to the plane on which the substrate is disposed.

10. The display substrate according to claim 1, further comprising:
    at least one of an interlayer insulating layer, a gate insulating layer and a buffer layer between the passivation layer and the substrate,
    wherein at least one protrusion is between the passivation layer and the interlayer insulating layer; and/or
    at least one protrusion is between the interlayer insulating layer and the gate insulating layer; and/or
    at least one protrusion is between the gate insulating layer and the buffer layer; and/or
    at least one protrusion is between the buffer layer and the substrate, wherein at least a portion of the protrusion is configured to be in a same layer and made of a same material as the interlayer insulating layer; and/or at least a portion of the protrusion is configured to be in a same layer and made of a same material as the gate insulating layer; and/or at least a portion of the protrusion is configured to be in a same layer and made of a same material as the buffer layer.

11. The display substrate according to claim 10, wherein at least a portion of the protrusion is configured to comprise a stack layer of a first protrusion and a second protrusion;

wherein the first protrusion is configured to be in a same layer and made of a same material as at least one of the interlayer insulating layer, the gate insulating layer and the buffer layer, and the second protrusion is configured as a photoresist material.

12. The display substrate according to claim 10, wherein a height of the protrusion is 0.2 µm-3 µm in a direction perpendicular to a plane on which the substrate is disposed; and a width of the protrusion is 3 µm-9 µm in a direction parallel to the plane on which the substrate is disposed.

13. The display substrate according to claim 10, wherein on a same layer parallel to the plane on which the substrate is disposed, the protrusion at least comprises a first protrusion portion and a second protrusion portion that are sequentially disposed around the display region, the first protrusion portion and the second protrusion portion are in a same layer, and the first protrusion portion is disposed inside the second protrusion portion, wherein a spacing distance between the first protrusion and the second protrusion is 3 µm-10 µm in the direction parallel to the plane on which the substrate is disposed.

14. The display substrate according to claim 10, wherein in the direction perpendicular to the plane on which the substrate is disposed, the protrusion at least comprises a first protrusion layer and a second protrusion layer that are in different layers, and the first protrusion layer is between the second protrusion layer and the substrate, wherein an orthographic projection of the first protrusion layer on the substrate is identical with an orthographic projection of the second protrusion layer on the substrate in a size and a position; or, a portion of the orthographic projection of the first protrusion layer on the substrate is located outside the orthographic projection of the second protrusion layer on the substrate, and an other portion of the orthographic projection of the first protrusion layer on the substrate is located inside the orthographic projection of the second protrusion layer on the substrate.

\* \* \* \* \*